United States Patent
Ruile et al.

(10) Patent No.: US 8,258,895 B2
(45) Date of Patent: Sep. 4, 2012

(54) ELECTROACOUSTIC COMPONENT

(75) Inventors: Werner Ruile, Munich (DE); Ulrike Roesler, Hebertshausen (DE)

(73) Assignee: EPCOS AG, Munich (DE)

( * ) Notice: Subject to any disclaimer, the term of this patent is extended or adjusted under 35 U.S.C. 154(b) by 939 days.

(21) Appl. No.: 12/094,710

(22) PCT Filed: Nov. 15, 2006

(86) PCT No.: PCT/DE2006/002005
§ 371 (c)(1),
(2), (4) Date: May 22, 2008

(87) PCT Pub. No.: WO2007/059733
PCT Pub. Date: May 31, 2007

(65) Prior Publication Data
US 2008/0292127 A1    Nov. 27, 2008

(30) Foreign Application Priority Data
Nov. 23, 2005    (DE) .................. 10 2005 055 870

(51) Int. Cl.
*H03H 9/00* (2006.01)
(52) U.S. Cl. ........................... 333/193; 333/195
(58) Field of Classification Search ............... 381/337; 333/193, 195; 310/311, 313, 320, 313 R
See application file for complete search history.

(56) References Cited

U.S. PATENT DOCUMENTS

| | | | |
|---|---|---|---|
| 5,953,433 A * | 9/1999 | Fujimoto et al. | 381/337 |
| 6,046,656 A | 4/2000 | Mishima | |
| 6,088,462 A * | 7/2000 | Fujimoto et al. | 381/160 |
| 6,747,529 B2 * | 6/2004 | Abe et al. | 333/188 |
| 6,784,764 B2 * | 8/2004 | Kadota et al. | 333/193 |
| 6,873,226 B2 * | 3/2005 | Mukai et al. | 333/133 |
| 7,224,101 B2 * | 5/2007 | Mishima et al. | 310/313 A |
| 7,262,676 B2 * | 8/2007 | Ruile et al. | 333/193 |
| 7,280,007 B2 * | 10/2007 | Feng et al. | 333/187 |
| 7,436,269 B2 * | 10/2008 | Wang et al. | 333/133 |
| 7,522,020 B2 * | 4/2009 | Kando | 333/193 |
| 7,573,178 B2 * | 8/2009 | Inoue et al. | 310/313 R |
| 7,609,129 B2 * | 10/2009 | Yokota et al. | 333/133 |
| 7,688,161 B2 * | 3/2010 | Miura et al. | 333/193 |
| 7,741,931 B2 * | 6/2010 | Matsuda et al. | 333/133 |
| 2005/0099091 A1 | 5/2005 | Mishima et al. | |
| 2007/0284965 A1 | 12/2007 | Kadota et al. | |

FOREIGN PATENT DOCUMENTS

| | | |
|---|---|---|
| DE | 103 25 281 | 12/2004 |
| WO | 98/51011 | 1/1998 |
| WO | WO01/29964 | 4/2001 |
| WO | WO03/088475 | 10/2003 |
| WO | WO03/088482 | 10/2003 |
| WO | WO2004/109913 | 12/2004 |

(Continued)

OTHER PUBLICATIONS

English translation of Written Opinion for PCT/DE2006/002005.

(Continued)

*Primary Examiner* — Mohamad Musleh
*Assistant Examiner* — Joselito Baisa
(74) *Attorney, Agent, or Firm* — Fish & Richardson P.C.

(57) ABSTRACT

An electroacoustic component includes a carrier substrate and a piezosubstrate having piezoelectric properties. The electroacoustic component also includes a layer system between the carrier substrate and the piezosubstrate.

25 Claims, 2 Drawing Sheets

FOREIGN PATENT DOCUMENTS

| | | |
|---|---|---|
| WO | 2005/050836 | 6/2005 |
| WO | 2005/093949 | 10/2005 |

OTHER PUBLICATIONS

International Search Report for PCT/DE2006/002005.
Writeen Opinion for PCT/DE2006/002005.
Japanese Patent Office, Notification of Reasons for Refusal (type I office action) in JP Patent Application No. 2008-541578, mailed Dec. 15, 2011, 4 pages.
Translation of the Decision of Refusal in Japanese Patent Application No. 2008-541578, mailed May 9, 2012, 3 pages.

* cited by examiner

ELECTROACOUSTIC COMPONENT

CROSS REFERENCE TO RELATED APPLICATIONS

Pursuant to 35 USC §120, this application claims the benefit PCT/DE2006/002005 filed Nov. 15, 2006 which claims the benefit of German Patent Application No. 102005055870.4 filed Nov. 23, 2005. Each of these applications is incorporated by reference in its entirety.

TECHNICAL FIELD

An electroacoustic component, in particular a component operating with guided bulk acoustic waves, will be specified.

BACKGROUND

Components operating with guided bulk acoustic waves are known, for example, from the publications DE 10325281 A1, US 2005/0099091 A1, U.S. Pat. No. 6,046,656, WO 01/29964 A1, WO 03/088475 A1 and WO 03/088482 A1.

SUMMARY

One problem to be solved is to specify a robust electroacoustic component with good properties with regard to its coefficient of linear thermal expansion.

An electroacoustic component is specified with a layer system suitable for conducting guided bulk acoustic waves (GBAW), a carrier substrate and a piezosubstrate that is relatively thin in comparison to the carrier substrate. The layer system is arranged between the two substrates.

The thickness of the piezosubstrate in a first embodiment is at most half the thickness of the carrier substrate.

According to a second preferred embodiment, the piezosubstrate has a monocrystalline structure and is at most $50\lambda$ thick, at most $30\lambda$ thick in one preferred variant, where $\lambda$ is the wavelength of the GBAW at, for instance, an operating frequency or the center frequency of the specified component.

According to a third preferred embodiment, the piezosubstrate is thinned down in a mechanical process. Thinning down is understood to mean the removal of part of the substrate material after the production of the layer structure of the carrier substrate, the layer system and the piezosubstrate. The piezosubstrate can be thinned down to a thickness of $5\lambda$ in one variant.

Silicon, for example, is suitable as a material for the carrier substrate for reasons of cost. This material is also advantageous with respect to increasing the integration density of the specified component. A crystal orientation of 111 or 100 is preferred for the silicon crystal. However, $Al_2O_3$, glass or an (organic) synthetic material, e.g., FR4, is also suitable. The carrier substrate can also have piezoelectric properties. Materials with a relatively low coefficient of thermal expansion (compared to the piezosubstrate) are preferred for the carrier substrate. The coefficient of expansion of the carrier substrate can be at least 50% smaller than that of the piezosubstrate, for example.

A piezosubstrate is understood to be a substrate made of a material with piezoelectric properties. The piezosubstrate is preferably cut from a single crystal. Particularly $LiTaO_3$, $LiNbO_3$, ZnO, $KNbO_3$, $NaKNbO_3$ quartz or other piezoelectric materials can be considered as single crystals for this purpose. The piezosubstrate can be formed, for instance, from $LiTaO_3$ with a cut angle $\phi$ rot YX, where $7°<\phi<24°$. In a preferred variant, $12°<\phi<21°$. It is possible to achieve a high electric bandwidth with electroacoustic components made of $LiTaO_3$ as a substrate and with such a cut angle.

The specified component, its mode of operation and preferred embodiments will be explained below.

An electric signal applied to the component structures (i.e., electrodes of a transducer) stimulates deflections of atoms in the piezoelectric substrate, exciting a bulk acoustic wave which can be guided in a horizontal plane, more particularly, in the dielectric layer and in the vicinity of this layer.

The acoustic energy of a GBAW in a component operating with GBAW is primarily centered in the area in which the wave is excited, and decays in both directions perpendicular to the layer structure of the component. This decay is achieved by a waveguide structure, i.e., a velocity profile in the vertical direction. The lowest propagation velocity exists in a preferably thin layer (dielectric layer) in the vicinity of the excitation plane of the acoustic waves. This layer is arranged between substrates with higher acoustic propagation velocities.

The GBAW is excited in the layer system, or at its boundary surface with the piezosubstrate, and is guided mainly in this layer system. In one advantageous variant, the layer system comprises a metal layer in which the component structures that excite the GBAW are formed, and a relatively thin dielectric layer with a low propagation velocity of acoustic waves.

The dielectric layer is preferably made of silicon oxide. $SiO_2$ is advantageous as the material for the dielectric layer because an $SiO_2$ surface is suitable for direct wafer bonding. $TeO_2$, for instance, is suitable as an alternative to $SiO_2$. In principle, any desired materials with a relatively low acoustic impedance (relative to the acoustic impedance of the metal layer) can be considered as a material for the dielectric layer.

The quality of the dielectric layer can be judged on the basis of its optical index of refraction. A dielectric layer of $SiO_2$ with an index of refraction between 1.44 and 1.48 is preferred. The $SiO_2$ of the dielectric layer is preferably stoichiometric.

The metal layer with the component structures formed in it is preferably arranged directly on the piezosubstrate. The component structures are embedded between the piezosubstrate and the dielectric layer.

The metal layer can consist of a single layer having a high conductivity and a relatively high acoustic impedance. In a preferred variant, the metal layer comprises several sublayers, including a first sublayer with a high conductivity and a second sublayer with a high acoustic impedance. The metal layer can be a sublayer of Al and another sublayer of W or Pt for example. Sublayers of the metal layer can in principle consist of metals, metal alloys or other conductive materials.

A typical footprint of the component is 500-700 mm$^2$. The overall thickness of the component in one variant is approximately 200 µm and is preferably not greater than 100 wavelengths. The overall thickness of the component can also be less than 200 µm, however.

Due to the differing coefficients of linear expansion of the two substrates, mechanical strains, which can be particularly large at the boundary surface of the piezosubstrate and the layer system, arise in the layer structure of the component in case of a temperature change.

The thickness of the piezosubstrate is preferably selected such that the mechanical strains due to the differing coefficients of linear expansion of the two substrates are directed into the overall volume of the piezosubstrate, so that the piezosubstrate can follow the expansion of the carrier substrate. Thus the coefficient of linear thermal expansion of the overall structure—including the piezosubstrate—can be adapted to that of the carrier substrate.

The thickness of the piezosubstrate is preferably between 3 and 30 wavelengths, at most 70 μm in a preferred variant. The piezosubstrate can have a greater thickness during the application of the layers of the layer sequence, and only be thinned to the above-described thickness value in a subsequent process step.

In order to form the dielectric layer, one can use a material with a temperature coefficient (TCF) of its elastic constants that is opposite to the temperature coefficient of the elastic constants of the piezosubstrate, the temperature coefficient of the dielectric layer being negative in case of a positive temperature coefficient of the respective substrate, and vice versa. With opposite TCFs of the two adjacent layers it is possible to keep the temperature coefficient of the overall component low.

The thickness of the layer system arranged between the piezosubstrate and the carrier substrate is preferably equal to the thickness of the dielectric layer, since the component structures of the metal layer are embedded in the dielectric layer and preferably do not project above it. The layer thickness in one variant is between $0.1\lambda$ and $\lambda$, preferably between $0.15\lambda$ and $0.5\lambda$, or between 0.3 and 1 μm. The overall thickness of the carrier substrate and the layer system together is preferably not greater than 100 wavelengths or 200 μm.

With the above-specified thicknesses for the substrates and the layer system, it is possible to achieve a low temperature coefficient of the component, in one variant $|TCF|<40$ ppm/K. Thus, stable electrical properties of the component can be guaranteed over a wide temperature range.

The exposed (outward-facing) rear side of the piezosubstrate is preferably metallized over a large surface area. This metallization is preferably connected to ground and serves as an electromagnetic shield for component structures. Metal surfaces provided as terminals of the component and/or labeling of the component can be formed in this metallization.

Through-hole contacts, which conductively connect terminals arranged on a surface of the carrier substrate to the contact areas, are preferably formed in the carrier substrate. The through-hole contacts can be constructed as tubes (optionally with a tapering cross-section) or as openings with metallized inner walls. The openings provided for through-hole contacts in the carrier substrate can also be filled with metal, however.

The specified component can be produced in the following process, for example. A first wafer (e.g., $LiTaO_3$ wafer) is prepared, which is suitable for simultaneous production of several components or component regions. A second wafer (e.g., an Si wafer) is prepared, which is suitable for producing carrier substrates. Areas of the respective substrate provided for component regions preferably form a regular matrix.

Component structures—more particularly, electroacoustic transducers—and contact areas conductively connected to them are formed, preferably photolithographically, on the first wafer for each component region. A dielectric layer is applied to the surface of the piezosubstrate bearing the component structures over a large area, e.g., in a CVD process (CVD=chemical vapor deposition) or by means of sputtering.

In a preferred variant of the method, the dielectric layer is planarized, for example, by means of a CMP process. CMP stands for chemical mechanical polishing.

It can be advantageous to thin the dielectric layer in order, for instance, to change the frequency position of the component structures. This can take place in the planarization step. The frequency position of component structures, or the thickness of the dielectric layer, is adjusted such that the frequency position provided for the component results after bonding to the second wafer.

The first wafer is now bonded to the second wafer, by direct wafer bonding, for example. Wafer bonding is preferably performed at relatively low temperatures, such as room temperature. A composite wafer with component regions to be separated is formed.

The composite wafer can be thinned on the side of the first wafer. The composite wafer is saw-scored, preferably in a V-shape, at least down to the carrier substrate on the side of the piezosubstrate, along dividing lines, i.e., between the component regions. It is also advantageous to cut into the carrier substrate down to a certain depth. In particular, oblique abutting edges of the piezosubstrate and the layer system are produced in this way that, together with the (flat) rear side of the metallized piezosubstrate, can be hermetically sealed and therefore encapsulated. The component structures are thereby protected against corrosion, as well as being shielded against external electromagnetic fields.

On the side of the carrier substrate, openings—contact holes—through-hole contacts for contacting contact areas are produced by etching and subsequent metallization, for example. External terminals for components are preferably produced in the same process step on the outward-facing surface of the second wafer.

A thin silicon wafer with prefabricated contact holes for bonding to the piezosubstrate could be used as a carrier substrate. Prefabricated semiconductor structures such as diodes and transistors can be formed on the carrier substrate, or on its surface.

In an advantageous embodiment, the piezosubstrate can be arranged between the layer system and a cover substrate, which preferably has physical properties, e.g., the temperature coefficient of the elastic constants, similar to those of the carrier substrate. It is advantageous to arrange the piezosubstrate between two substrates—a carrier substrate and a cover substrate—which both have a behavior and/or a smaller expansion coefficient opposite to the temperature coefficient of the elastic constants of the piezosubstrate.

The thickness of the piezosubstrate is preferably less than that of the cover substrate. It is beneficial to choose the thickness of the piezosubstrate to be less than the total thickness of the cover substrate and carrier substrate. The thickness of the piezosubstrate can, for example, be chosen to be less than half the sum of the thicknesses of the cover substrate and the carrier substrate.

Glass, silicon or silicon dioxide, for instance, is suitable as the material for a cover substrate. It is advantageous to use, for the cover substrate and the carrier substrate, materials, preferably identical, that are suitable for direct wafer bonding.

The exposed surface of the cover substrate can be metallized to form electrical shielding and/or electrical connections, for example. It is also possible, however, for the cover substrate to have the same construction characteristics, such as contact holes and integrated semiconductor structures, that were described in connection with the carrier substrate. The contact holes in this case are preferably run through the cover substrate and the piezosubstrate all the way to metal layers contained in the layer system.

In principle, a metal layer can be provided between the piezosubstrate and the cover substrate in which, for example, contact areas and electroacoustic structures suitable for wave generation and guidance can be formed. Other intermediate layers are also possible.

In one variant, it is possible to bond the first wafer, a composite of the carrier substrate, the layer system and the possibly thinned-down piezosubstrate, to the cover substrate in the form of a second wafer.

In another variant, it is possible to join or bond the piezosubstrate first to the cover substrate and to form the already described piezosubstrate layer system on the side of the piezosubstrate facing away from the cover substrate. The wafer thus produced can be joined to the wafer provided as a carrier substrate by bonding, for example. The piezosubstrate is preferably thinned down, and its surface is polished so that it is suitable for the application of component structures (transducers, contact areas, electrical connections).

The component and the method for manufacturing it will be described below using schematic figures not drawn to scale. Therein

DETAILED DESCRIPTION

Figure 1A:
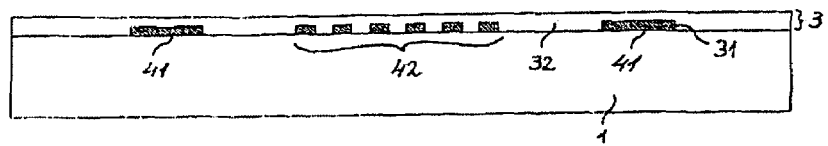
FIGS. 1A-1G show process steps in the manufacturing method.
Figure 1B:
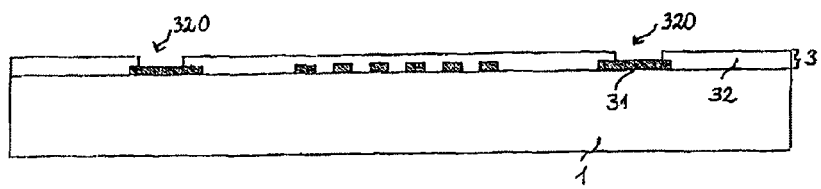
Figure 1C:
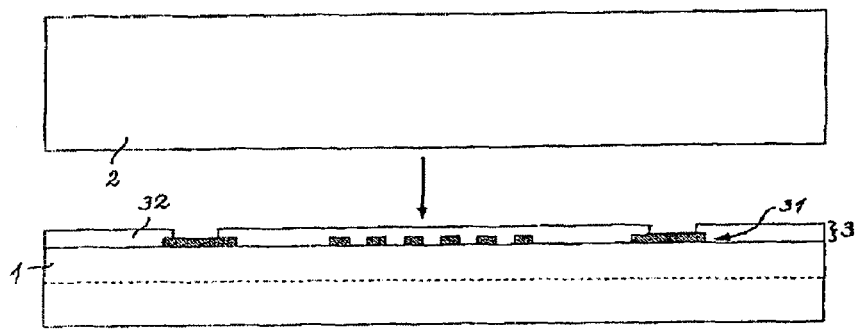
Figure 1D:
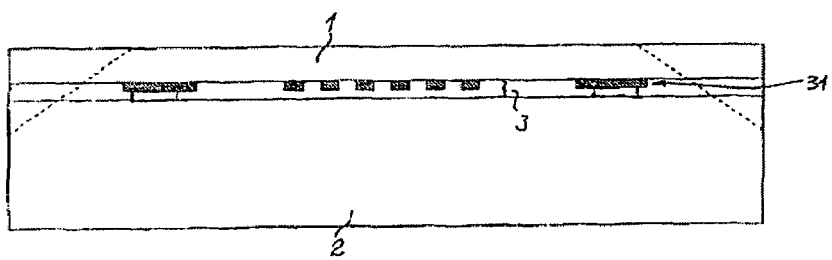
Figure 1E:
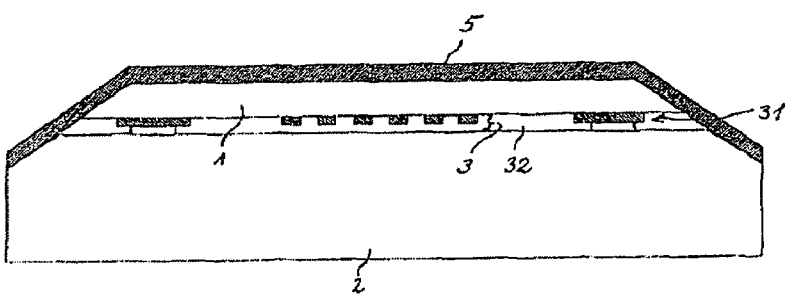
Figure 1F:
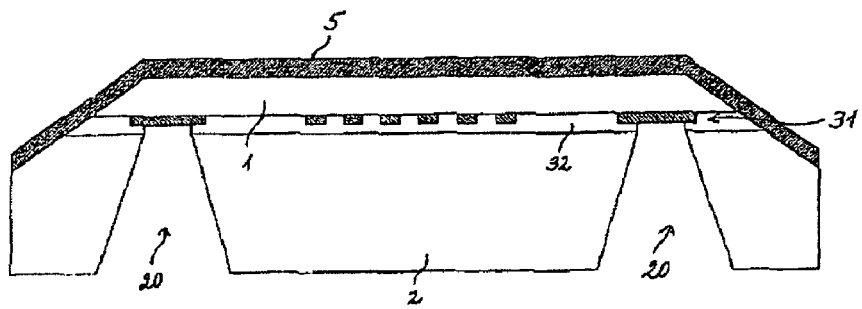
Figure 1G:
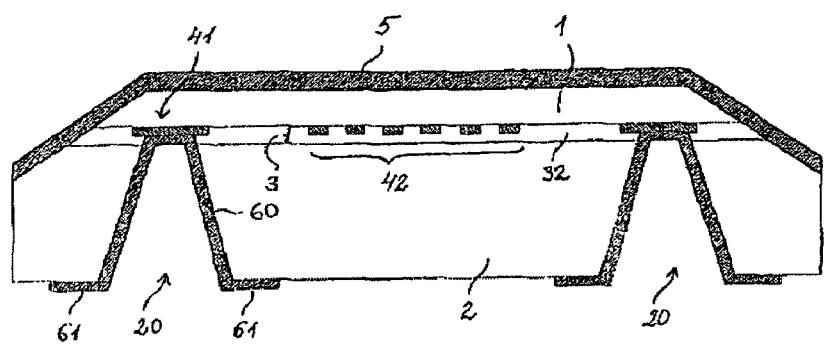

A component operating with GBAW is shown in FIG. 1G. A layer system 3 is arranged between a piezosubstrate 1 and a markedly thicker carrier substrate 2. In view of the small thickness of the piezosubstrate, the thickness of the carrier substrate is preferably selected to be sufficiently large that it is sufficient for the mechanical stability of the component.

Carrier substrate 2 preferably has a lower thermal expansion than piezosubstrate 1.

The thickness of the piezosubstrate and the carrier substrate is, respectively, 50 μm and 150 μm in one variant. The thickness of the layer system in one variant is 0.6 μm.

Layer system 3 comprises a metal layer 31 arranged on piezosubstrate 1. Metal layer 31 is structured and comprises electroacoustically active regions 42, such as transducers, and contact areas 41 conductively connected thereto. Structures 41, 42 of the metal layer 31 are encapsulated between piezosubstrate 1 and a dielectric layer 32 of $SiO_2$, for example.

Piezosubstrate 1 is preferably piezoelectric, of $LiTaO_3$, in one variant $LiTaO_3$ $\alpha$rotYX where $15°<\alpha<20°$. The carrier substrate is preferably made of a high-ohmic silicon. The acoustic velocity in substrates 1, 2 is markedly higher—at least 20% for example—than in the dielectric layer.

Contact holes 20 with exposed contact areas 41 therein are provided in the composite formed from carrier substrate 2 and dielectric layer 32. A metallization 60 that covers the inside walls of the contact holes and the exposed regions of the contact areas is provided in the area of the contact holes. The metallization 60 is additionally arranged in part on the underside of carrier substrate 2 and forms external contacts 61.

A first wafer is shown in FIG. 1A. In the manufacturing of the first wafer, a structured metal layer 31 is first applied to a first substrate 1. A dielectric layer 32 is then applied to piezosubstrate 1 over metal layer 31.

Dielectric layer 32 is preferably planarized. In the next step (FIG. 1B), regions 320 of dielectric layer 32 are etched away in order, in particular, to expose contact areas 41 at least in part. It is thus possible to measure electric parameters of component regions. In case the actual values of these parameters deviate from the nominal values, the layer system can be trimmed both mechanically and electrically in this process stage. For the electrical trimming, for instance, trimming structures not shown here are modified and thus the electrical impedance of component structures is modified. For mechanical trimming, the dielectric layer can be thinned.

Next, wafer 1, 3 is joined to a second wafer or carrier substrate 2, preferably by means of direct wafer bonding (FIG. 1C). It is indicated with a dashed line in FIG. 1C that the piezosubstrate has been thinned.

By thinning down the piezosubstrate, which as a rule has a higher thermal expansion than the carrier substrate, the thermal expansion of the entire component is improved, as is the temperature coefficient in the case of a combination of substrates made of Si and $LiTaO_3$.

The representation according to FIGS. 1A-1C is rotated by 180° with respect to the representation according to FIGS. 1D-1G, so that carrier substrate 2 is turned toward the bottom and piezosubstrate 1 is turned toward the top in FIGS. 1D-1G.

Piezosubstrate 1 has already been thinned in FIG. 1D. It is indicated with dashed lines in FIG. 1D that abutting edges of the piezosubstrate, layer system 3, and abutting edges of the carrier substrate in part as well, have been beveled by, for instance, a V-shaped sawed incision between two component regions.

The rear side of the piezosubstrate and, in particular, the interface still open in FIG. 1D between layer system 3 and substrates 1, 2 as well, are metallized (metal layer 5 in FIG. 1E), and thus sealed off against harmful environmental influences.

Contact holes 20, preferably with slanted walls, are produced in carrier substrate 2 (FIG. 1F). The contact holes 20 issue into openings 320 of the dielectric layer.

Thus contact areas are again exposed. A metallization 60, 61 is applied to parts of the surface of the carrier substrate, to the inner walls of contact holes 20 and to the exposed regions of contact areas 41.

Figure 2:
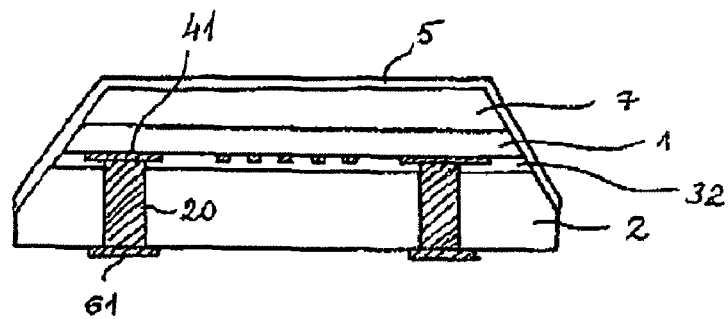
FIG. 2 shows the fundamental structure of a GBAW component with a carrier substrate and a cover substrate.

Another GBAW component is shown in FIG. 2, which unlike the variant presented in FIG. 1G additionally has a cover substrate 7 that is thicker than piezosubstrate 1.

The coefficient of expansion of substrates 2, 7 is lower than that of piezosubstrate 1. Substrates 2, 7 are preferably made from the same material, the expansion coefficients of which substantially determine the temperature coefficient of the component as a whole because of the higher overall thickness of these substrates in comparison to the thickness of piezosubstrate 1. It is thus possible to keep the thermal expansion of the overall component small.

The invention claimed is:

1. An electroacoustic component comprising:
   a carrier substrate;
   a monocrystalline piezosubstrate having piezoelectric properties, and
   a layer system between the carrier substrate and the piezosubstrate;
   wherein the piezosubstrate is 3-30λ thick, where λ is the wavelength of a guided bulk acoustic wave at a center frequency of the electroacoustic component, and the thickness of the piezosubstrate is at most half a thickness of the carrier substrate.

2. The component of claim 1, wherein the thickness of the piezosubstrate is at most 30% of the thickness of the carrier substrate.

3. The electroacoustic component of claim 1, wherein:
   the layer system is configured to conduct guided bulk acoustic waves,
   the piezosubstrate comprises a substrate thinned down by a mechanical process.

4. The component of claim 3, wherein a thickness of the piezosubstrate is at most half a thickness of the carrier substrate.

5. The component of claim 3, wherein the thickness of piezosubstrate is at most 30% of the thickness of carrier substrate.

6. The component of claim 1, wherein:
the layer system comprises a metal layer and a dielectric layer; and
transducers and contact areas are formed in the metal layer.

7. The component of claim 6, wherein the dielectric layer has a planar boundary surface.

8. The component of claim 6, wherein a layer thickness of the dielectric layer is between $0.01\lambda$, and $\lambda$.

9. The component of claim 6 wherein the dielectric layer has an opposite temperature dependence of the elastic constants relative to the carrier substrate.

10. The component of claim 6, wherein the dielectric layer comprises silicon oxide or tellurium dioxide.

11. The component of claim 1, wherein:
the piezosubstrate comprises $LiTaO_3$; and
the carrier substrate comprises Si.

12. The component of claim 1, wherein the material of the carrier substrate has a lower coefficient of linear thermal expansion than the material of the piezosubstrate.

13. The component of claim 1, further comprising:
a cover substrate having a coefficient of thermal expansion smaller than the coefficient of thermal expansion of the piezosubstrate; wherein
the piezosubstrate is between the cover substrate and the layer system.

14. The electroacoustic component of claim 1, further comprising:
a cover substrate; and
wherein the piezosubstrate is between the cover substrate and the layer system; and
coefficients of thermal expansion of the cover substrate and the carrier substrate are less than a coefficient of thermal expansion of the piezosubstrate.

15. The component of claim 14, wherein the cover substrate and the carrier substrate each have a temperature dependence of the elastic constants opposite to that of the piezosubstrate.

16. The component of claim 14, wherein a thickness of the piezosubstrate is less than a thickness of the cover substrate.

17. The component of claim 14, wherein a thickness of the piezosubstrate is less than a sum of the thicknesses of the cover substrate and the carrier substrate.

18. An electroacoustic component comprising;
a layer system configured to conduct guided bulk acoustic waves,
a carrier substrate; and
a piezosubstrate having piezoelectric properties, the piezosubstrate comprising a monocrystalline structure at most $50\lambda$ thick, where $\lambda$ is the wavelength of a guided bulk acoustic wave at a center frequency of the electroacoustic component.

19. The component of claim 18, wherein the piezosubstrate comprises a substrate thinned down by a mechanical process.

20. The component of claim 19, wherein a thickness of the piezosubstrate is at most half a thickness of the carrier substrate.

21. The component of claim 19, wherein the thickness of piezosubstrate is at most 30% of the thickness of carrier substrate.

22. The component of claim 18, further comprising:
a cover substrate; and
wherein the layer system is between the carrier substrate and the piezosubstrate and the piezosubstrate is between the cover substrate and the layer system; and
coefficients of thermal expansion of the cover substrate and the carrier substrate are less than a coefficient of thermal expansion of the piezosubstrate.

23. The component of claim 22, wherein the cover substrate and the carrier substrate each have a temperature dependence of the elastic constants opposite to that of the piezosubstrate.

24. The component of claim 22, wherein a thickness of the piezosubstrate is less than a thickness of the cover substrate.

25. The component of claim 22, wherein a thickness of the piezosubstrate is less than a sum of the thicknesses of the cover substrate and the carrier substrate.

* * * * *

UNITED STATES PATENT AND TRADEMARK OFFICE
CERTIFICATE OF CORRECTION

PATENT NO.         : 8,258,895 B2
APPLICATION NO.    : 12/094710
DATED              : September 4, 2012
INVENTOR(S)        : Werner Ruile and Ulrike Roesler It is certified that error appears in the above-identified patent and that said Letters Patent is hereby corrected as shown below:

Column 7, Line 11 (Approx.), In Claim 8, delete "0.01λ," and insert -- 0.01λ --

Column 8, Line 6, In Claim 18, delete "comprising;" and insert -- comprising: --

Signed and Sealed this
Sixth Day of November, 2012

David J. Kappos
*Director of the United States Patent and Trademark Office*